United States Patent [19]
Segawa et al.

[11] Patent Number: 5,457,698
[45] Date of Patent: Oct. 10, 1995

[54] TEST CIRCUIT HAVING A PLURALITY OF SCAN LATCH CIRCUITS

[75] Inventors: Hiroshi Segawa; Masahiko Yoshimoto, both of Itami, Japan

[73] Assignee: Mitsubishi Denki Kabushiki Kaisha, Tokyo, Japan

[21] Appl. No.: 8,659

[22] Filed: Jan. 25, 1993

[30] Foreign Application Priority Data

Feb. 25, 1992 [JP] Japan ..................................... 4-037584

[51] Int. Cl.$^6$ ................................................. H04B 17/00
[52] U.S. Cl. ........................................... 371/223; 371/22.5
[58] Field of Search .................................. 371/22.3, 22.5, 371/15.1; 307/272.2, 481, 279, 272.1; 365/201, 154; 341/160, 94; 327/185, 202, 208

[56] References Cited

U.S. PATENT DOCUMENTS

| | | | |
|---|---|---|---|
| 3,812,388 | 5/1974 | Southworth | 307/481 |
| 4,554,664 | 11/1985 | Schultz | 371/22.3 |
| 4,669,061 | 5/1987 | Bhavsar | 365/201 |
| 4,760,283 | 7/1988 | Weaver | 307/279 |
| 4,910,734 | 3/1990 | Segawa et al. | 371/15.1 |
| 5,012,246 | 4/1991 | Chung et al. | 341/160 |
| 5,172,011 | 12/1992 | Leuthold et al. | 307/272.2 |

FOREIGN PATENT DOCUMENTS

| | | |
|---|---|---|
| 3146721 | 9/1982 | Germany . |
| 3838939 | 6/1989 | Germany . |
| 3838940 | 6/1989 | Germany . |

OTHER PUBLICATIONS

Carver Mead, et al., pp. 66–67, and pp. 75–76, "Introduction to VLSI Systems" Oct. 1980.
Latch Scanning Arrangements, pp. 102–109, Frank F. Tsui, "LSI/VLSI Testability Design" 1987 no month.

*Primary Examiner*—Emanuel T. Voeltz
*Assistant Examiner*—Hal D. Wachsman
*Attorney, Agent, or Firm*—Oblon, Spivak, McClelland, Maier, & Neustadt

[57] ABSTRACT

A technique for reducing the circuit area of a test circuit which is formed by a parallel register which includes a plurality of scan latch circuits is disclosed. A scan latch circuit is formed by a master-slave latch circuit. The master-slave latch circuit includes a static latch circuit which serves as a master side latch circuit and a dynamic latch circuit which serves as a slave side latch circuit. Under the control of a control signal, either a signal inputted to a first circuit part or a signal inputted to a preceding stage scan latch circuit is held in the static latch circuit. The signal which was inputted to a first circuit part is outputted via an output terminal of the scan latch circuit to a second circuit part. The signal which was inputted to the preceding stage scan latch circuit is advanced to the dynamic latch circuit and thereafter outputted to a next scan latch circuit via other output terminal of the scan latch circuit. Thus, since the dynamic latch circuit is used as the slave since latch circuit, the test circuit includes less elements, thereby less circuit area is required for the test circuit.

13 Claims, 6 Drawing Sheets

TEST CIRCUIT HAVING A PLURALITY OF SCAN LATCH CIRCUITS

BACKGROUND OF THE INVENTION

1. Field of the Invention

The present invention relates to a test circuit which is incorporated in a large circuit such as an LSI device to test a plurality of circuit parts forming the large circuit, and more particularly to size reduction technique of the test circuit.

2. Description of the Background Art

Recent years have seen wider use of exceedingly larger circuits such as an LSI. Designs of such circuits become more and more complex, and so do testing methods for testing such circuits. A current approach to avoid the test complexity involves division of an integrated circuit into some portions. A test circuit is inserted between the divided circuit portions. Due to this circuit design, it is possible to test each individual divided circuit portion.

FIG. 1 is a block diagram of a conventional test circuit of a scan-register system for testing circuit parts of an integrated circuit. Incorporated between the circuit parts, the test circuit carries out a test.

In a test using the test conventional circuit, test data are inputted to a selected circuit part to be tested via a parallel register which is connected to input terminals of the selected circuit part. The data are processed in the circuit part and outputted through a parallel register which is connected to output terminals of the circuit part, followed by examination of the output data. In non-test operation, data are transferred from a circuit part to a circuit part via the parallel registers so that the integrated circuit which is formed by the circuit parts performs normal operations.

In FIG. 1, the integrated circuit comprises a first circuit part $1a$, a second circuit part $2a$ and a third circuit part $3a$. The first, the second and the third circuit parts $1a$, $2a$ and $3a$ have n input terminals 11, 21 and 31 and n output terminals 12, 22 and 32, respectively. The test circuit is formed by two parallel registers, one including n scan latch circuits $9_1$ to $9_n$ inserted between the first circuit part $1a$ and the second circuit part $2a$ and another including n scan latch circuits $9_{n+1}$ to $9_{2n}$ inserted between the second circuit part $2a$ and the third circuit part $3a$.

The scan latch circuits $9_1$ to $9_n$ each have a first input terminal a, a second input terminal b, a control terminal c, an output terminal d and another output terminal $S_o$. Under the control of a control signal C given to the control terminal c, a signal fed to the first input terminal a is outputted at the output terminal d or a signal fed to the second input terminal b is outputted at the output terminal $S_o$.

Next, the overall structure of the integrated circuit will be described. The input terminals a of the first to the n-th stage scan latch circuits $9_1$ to $9_n$ are connected to the output terminals 12 of the first circuit part $1a$. Likewise, the output terminals d are connected to the input terminals 21 of the second circuit part $2a$. The output terminals $S_o$ of the scan latch circuits $9_1$ to $9_n$ are connected to the second input terminals b of the scan latch circuits $9_2$ to $9_{n+1}$, respectively. The input terminals a of the (n+1)-th to the 2n-th stage scan latch circuits $9_{n+1}$ to $9_{2n}$ are connected to the output terminals 22 of the second circuit part $2a$. The output terminals $S_o$ of the (n+1)-th to the (2n−1)-th stage scan latch circuits $9_{n+1}$ to $9_{2n-1}$ are connected to the second input terminals b of the post-stage scan latch circuits $9_{n+2}$ to $9_{2n}$. The control terminals c, which are to receive the control signal C, of all of the scan latch circuits $9_1$ to $9_{2n}$ are connected in common.

The input terminals 11 of the first circuit part $1a$ are connected to data input terminals $I_1$ to $I_n$ of the integrated circuit. The third circuit part $3a$ has their output terminals 32 connected to data output terminals $O_1$ to $O_n$ of the integrated circuit, respectively.

FIG. 2 is a block diagram showing an example of what structure the scan latch circuits $9_1$ to $9_{2n}$ of FIG. 1 each have. As shown in FIG. 2, each scan latch circuit is formed by a multiplexer 7, which includes an invertor 4 and transmission gates 5 and 6, and two static latch circuits 8. In the multiplexer 7, the control signal C fed to the control terminal c is given to an input terminal of the invertor 4 and a control electrode of the transmission gate 6, a signal $DI_1$ fed to the first input terminal a is passed to one electrode of the transmission gate 5, and a signal $DI_2$ received at the second input terminal b is given to one electrode of the transmission gate 6. Hence, the control signal C of "L" level turns on the transmission gate 5 and turns off the transmission gate 6, passing the signal $DI_1$ to the static latch circuits 8. On the other hand, with the control signal C of "H" level, the transmission gate 5 is unactuated and the transmission gate 6 is actuated, thereby transmitting the signal $DI_2$ to the static latch circuits 8.

The two static latch circuits 8 form a master-slave latch circuit which operates in synchronism with a clock signal $\phi$. In response to the clock signal $\phi$ of "H" level, data DI are allowed into the front stage static latch circuit 8 from the multiplexer 7. When the clock signal $\phi$ is switched to "L" level, the data DI are sent to the rear stage static latch circuit 8 and outputted therefrom while held in the front stage static latch circuit 8. In short, circuit operation of the scan latch circuits $9_1$ to $9_{2n}$ for the "L" level control signal C is to receive the signal $DI_1$ which is available at the first input terminals a and to output the same at the output terminals d and $S_o$. If the control signal C has "H" level, on the other hand, the scan latch circuits $9_1$ to $9_{2n}$ receive the signal $DI_2$ which is available at the second input terminals b and output the same at the output terminals d and $S_o$.

FIGS. 3A to 3D are circuit diagrams showing modifications of each static latch circuit 8. In FIGS. 3A to 3D, the symbol $TG_n$ denotes a transmission gate formed by an N type MOS transistor and the symbol $TG_p$ denotes a transmission gate formed by a P type MOS transistor. Indicated at IN1 to IN4 are invertors. The clock signal for triggering the static latch circuits 8 into operation is indicated at $\phi_{in}$, while the signal inputted to the static latch circuits 8 is indicated at DI.

The static latch circuit 8 of FIG. 3A receives the data DI via one terminal of the transmission gate $TG_n$, which also receives the control of the clock signal $\phi_{in}$ at its control electrode. Other terminal of the transmission gate $TG_n$ is connected to an input terminal of the invertor IN1 which has its output terminal connected to an input terminal of the invertor IN2. Hence, data DO are outputted at an output terminal of the invertor IN2. Under the control of the clock signal $\phi_{in}$ which is fed to the control electrode of the transmission gate $TG_p$, the static latch circuit holds the data therein since the one electrode of the transmission gate $TG_p$ is connected to the output terminal of the invertor IN2 and other electrode of the transmission gate $TG_p$ is connected to the input terminal of the invertor IN1.

In the static latch circuit 8 of FIG. 3B, data input of the data DI is accomplished via one terminal of the transmission gate $TG_n$, which receives the clock signal $\phi_{in}$ at its control electrode. Another terminal of the transmission gate $TG_n$ is connected to an input terminal of the invertor IN1 which has its output terminal connected to an input terminal of the invertor IN2. The data DO are outputted at an output terminal of the invertor IN2. In addition, the output terminal of the invertor IN1 is connected to an input terminal of the invertor IN3 and the input terminal of the invertor IN1 is connected to an output terminal of the invertor IN3, which allows that the data is held in the static latch circuit.

In the static latch circuit 8 of FIG. 3C, the clock signal $\phi_{in}$ is fed to the invertor IN4 where it is inverted. The reverse clock signal is then relayed to a control electrode of the first transmission gate $TG_p$. The data DI are inputted to the transmission gate $TG_n$, which is governed by the dock signal $\phi_{in}$ received at its control electrode, and to one terminal of the first transmission gate $TG_p$, which is controlled by the reverse clock signal received at its control electrode. Other terminals of the transmission gates $TG_n$ and $TG_p$ are connected to an input terminal of the invertor IN1. An output terminal of the invertor IN1 is connected to an input terminal of the invertor IN2. The data DO are outputted at an output terminal of the invertor IN2. With the clock signal $\phi_{in}$ applied to the control electrode of the first transmission gate $TG_p$ and the reverse clock signal applied to the control electrode of the second transmission gate $TG_n$, the data are held in the static latch circuit due to the structure that the transmission gates $TG_n$ and $TG_p$ have their one side electrodes connected to the output terminal of the invertor IN1 and their other side electrodes connected to the input terminal of the invertor IN1.

The static latch circuit 8 of FIG. 3D requires that the clock signal $\phi_{in}$ is fed to the invertor IN4 where it is inverted. The reverse clock signal is then supplied to a control electrode of the first transmission gate $TG_p$. The data DI are inputted to the transmission gate $TG_n$, which receives the clock signal $\phi_{in}$ at its control electrode, and to one terminal of the first transmission gate $TG_p$, which receives the reverse clock signal at its control electrode. Other terminals of the transmission gates $TG_n$ and $TG_p$ are connected to an input terminal of the invertor IN1. An output terminal of the invertor IN1 is connected to an input terminal of the invertor IN2. The data DO are outputted at an output terminal of the invertor IN2. The output terminal of the invertor IN1 is connected to an input terminal of the invertor IN3 while the input terminal of the invertor IN1 is connected to an output terminal of the invertor IN3, thereby ensuring the data are held in the static latch circuit.

Operations of the test circuit will be now described. The operations are divided into two modes; that is, operation mode wherein the control signal C stays at "L" level and shifting mode wherein the control signal C stays at "H" level.

In the operation mode, all the scan latch circuits $9_1$ to $9_{2n}$ are in a condition to receive the data which are sent to the first input terminals a. Data inputted in a parallel manner at the data input terminals $I_1$ to $I_n$ are entered in the circuit part 1a where they are processed. The processed data are outputted at the output terminals 12. The data are thereafter advanced to the input terminals a of the scan latch circuits $9_1$ to $9_n$, latched in the first static latch circuit 8, and outputted at the output terminals d. Thus, the data outputted at the output terminals 12 are entered to the scan latch circuits $9_1$ to $9_n$, and then transmitted to the second circuit part 2a via the input terminals 21. The data are processed in the second circuit part 2a and outputted at the output terminals 22. This is followed by similar data transmission in which the data from the output terminals 22 are given to the first input terminals a of the scan latch circuits $9_{2n}$ to $9_{n+1}$, latched in the first static latch circuit 8, and outputted at the output terminals d. Thus, the data outputted at the output terminals 22 are passed through the scan latch circuits $9_{2n}$ to $9_{n+1}$, and thereafter transmitted to the third circuit part 3a via the input terminals 31. The data processed in the third circuit part 3a are outputted at the output terminals $O_1$ to $O_n$ in a parallel manner. That is, in the operation mode, the circuit as a whole formed by the circuit parts 1a, 2a and 3a performs normal data processing in synchronism with the clock signal $\phi$.

In the shifting mode, on the other hand, all the scan latch circuits $9_1$ to $9_{2n}$ are ready to receive the data which are given to the second input terminals b. The scan latch circuits $9_1$ to $9_{2n}$ function as one shift register. In the first stage scan latch circuit $9_1$, serial data DI given to the second input terminal b are advanced to the first static latch circuit 8 and latched therein. The data are then advanced to the second static latch circuit 8 and latched therein, followed by that the data are outputted at the output terminal $S_o$. These actions are in synchronism with the clock signal $\phi$. Following this, the data are given to the second input terminal b of the second stage scan latch circuit $9_2$ in which they are latched in the first and the second static latch circuits 8 in sequence and then outputted at the output terminal $S_o$ in synchronism with the clock signal $\phi$. By repeating this, the data are shifted by one stage in succession from the scan latch circuit $9_2$ to the scan latch circuit $9_{2n}$, and finally, outputted as serial data SO at the output terminal d of the last stage scan latch circuit $9_{2n}$.

Individual testing of each circuit part is accomplished by performing the operation mode operation and shifting mode operation in combination. The second circuit part 2a of FIG. 1, for example. is tested in the following manner.

First, the control signal C is switched to "H" level to bring the test circuit into the shifting mode. Next, test data DI for testing the second circuit part 2a are serially inputted, via the test data input terminals, to the second input terminal b of the first scan latch circuit $9_1$, thereby storing the serial data SI in the first to the n-th stage scan latch circuits $9_1$ to $9_n$.

The control signal C is switched to "L" level to enter the test circuit into the operation mode, allowing that the output data from the second circuit part 2a are entered into the (n+1)-th to the 2n-th stage scan latch circuits $9_{n+1}$ to $9_{2n}$. Following this, the test circuit is switched into the shifting mode again. The data in the scan latch circuits $9_{n+1}$ to $9_{2n}$ are shifted and outputted outside the test circuit via the output terminal d of the last stage scan latch circuit $9_{2n}$. The data SO thus outputted are then examined.

As can be seen from the foregoing, the conventional test circuit, the structure of which is as heretofore described, requires a large circuit area compared to circuit parts which perform normal circuit operations.

SUMMARY OF THE INVENTION

A test circuit according to an aspect of the present invention has a clock input terminal, a test control terminal and a test data input terminal. The test circuit is provided in a circuit having first and second circuit parts and incorporated between the first circuit part and the second circuit part, the first circuit part having a plurality of output terminals, the second circuit part having a plurality of input terminals, the output terminals of the first circuit part corresponding to the input terminals of the second circuit part on a one-to-one basis. The test circuit comprises a parallel register connected to the clock input terminal and the test control terminal, said parallel register including a plurality of scan latch circuits, the scan latch circuits being connected to the output terminals of the first circuit part and the input terminals of the second circuit part which correspond to the output terminals of the first circuit part, the parallel register being formed by connecting the test data input terminal and the scan latch circuits in series. The scan latch circuits each comprise a static latch circuit which operates in response to a first clock signal which is inputted to the clock input terminal and a dynamic latch circuit which operates in response to a second clock signal which is inputted to the clock input terminal. The scan latch circuits enter operation mode in response to a signal received at the test control terminal, in which case each scan latch circuit transfers data which are outputted at the output terminals of the first circuit part to the input terminals of the second circuit part through its static latch circuit. The scan latch circuits otherwise enter shifting mode in response to a signal received at the test control terminal. In the shifting mode, test data inputted to the test data input terminal are shifted in succession by one stage from a first scan latch circuit to the last scan latch circuit which are connected in series in such a manner that, in each scan latch circuit, the test data are latched in the static latch circuit and thereafter outputted through the dynamic latch circuit to a next stage scan latch circuit.

The scan latch circuits may each further comprise: a first input terminal connected to one of the output terminals of the first circuit part; a second input terminal for receiving the test data, the scan latch circuits receiving the test data via the second input terminals thereof from preceding stage scan latch circuits except the first scan latch circuit which receives the test data via the second input terminal thereof from the test data input terminal; a control terminal connected the test control terminal for receiving a control signal from the test control terminal; switching means for selectively advancing data which are inputted to the first input terminal or data which are inputted to the second input terminal to the static latch circuit; a first output terminal for outputting data which are latched in the static latch circuit to the input terminals of the second circuit parts; and a second output terminal for outputting data which are outputted from the dynamic latch circuit.

The switching means may include a multiplexer which comprises: a data selector terminal which is connected to the control terminal; a first data input terminal which is connected to the first input terminal; a second data input terminal which is connected to the second input terminal; and a data output terminal which is connected to an input terminal of the static latch circuit.

The multiplexer may further comprise: an invertor, an input terminal of the invertor being connected to the first data input terminal of the multiplexer; a first transistor, a control electrode of the first transistor being connected to an output terminal of the invertor, one electrode of the first transistor being connected to the first data input terminal of the multiplexer, another electrode of the first transistor being connected to the input terminal of the static latch circuit; and a second transistor, a control electrode of the second transistor being connected to the data selector terminal of the multiplexer, one electrode of the second transistor being connected to the second data input terminal of the multiplexer, and another electrode of the second transistor being connected to the input terminal of the static latch circuit.

In a preferred aspect, the second input terminals of the scan latch circuits and the second output terminals of preceding stage scan latch circuits or the test data input terminal are connected so that the test data input terminal and the scan latch circuits are connected in series, and the control terminals of the scan latch circuits are all connected in common so that the scan latch circuits taken as a whole can function as a shift register.

The circuit in which the test circuit is provided alternatively further includes a third circuit part which has a plurality of input terminals which correspond to the output terminals of the second circuit part on a one-to-one basis. The test circuit may further comprise a parallel register which is inserted between the second and the third circuit parts, which is connected to the clock input terminal and the test control terminal, and which includes a plurality of scan latch circuits which are connected in series with each other. The scan latch circuits are connected to the output terminals of the second circuit part and the input terminals of the third circuit part which correspond to the output terminals of the second circuit part. The parallel register inserted between the first and the second circuit parts and the parallel register inserted between the second and the third circuit parts are preferably connected in series in order to ensure data transmission therebetween, and the control terminals of the scan latch circuits are all connected in common so that the parallel registers can function as a shift register.

The second clock signal is preferably a reverse signal of the first clock signal.

The dynamic latch circuit may alternatively include: a transistor, one electrode of the transistor being connected to the input terminal of the dynamic latch circuit, a control electrode of the transistor receiving the second clock signal; a first invertor, an input terminal of the first invertor being connected to other electrode of the transistor; and a second invertor, an input terminal of the second invertor being connected to an output terminal of the invertor, an output terminal of the second invertor being connected to the output terminal of the dynamic latch circuit.

Instead, the dynamic latch circuit may include: a first conductivity type transistor, one electrode of the first conductivity type transistor being connected to the input terminal of the dynamic latch circuit, a control electrode of the first conductivity type transistor receiving the second clock signal; a first invertor, an input terminal of the first invertor being connected to another electrode of the first conductivity type transistor; a second invertor, an input terminal of the second invertor being connected to an output terminal of the first invertor, an output terminal of the second invertor being connected to the output terminal of the dynamic latch circuit; and a second conductivity type transistor, a control electrode of the second conductivity type transistor being connected to the output terminal of the first invertor, one electrode of the second conductivity type transistor being connected to a power source, another electrode of the second conductivity type transistor being connected to the input terminal of the first invertor.

Instead, the dynamic latch circuit may include: a first conductivity type transistor, one electrode of the first conductivity type transistor being connected to the input terminal of the dynamic latch circuit, a control electrode of the first conductivity type transistor receiving the second clock signal; a first invertor for receiving the reverse signal at its input terminal; a second conductivity type transistor, one electrode of the second conductivity type transistor being connected to the input terminal of the dynamic latch circuit, a control electrode of the second conductivity type transistor being connected to an output terminal of the first invertor; a second invertor, an input terminal of the second invertor being connected to other electrode of the first conductivity type transistor; and a third invertor, an input terminal of the third invertor being connected to an output terminal of the second invertor, an output terminal of the third invertor being connected to the output terminal of the dynamic latch circuit.

Instead, the dynamic latch circuit may include: a first conductivity type transistor, one electrode of the first conductivity type transistor being connected to the input terminal of the dynamic latch circuit, a control electrode of the first conductivity type transistor receiving the second clock signal; a first invertor for receiving the reverse signal at its input terminal; a second conductivity type first transistor, one electrode of the first transistor being connected to the input terminal of the dynamic latch circuit, a control electrode of the first transistor being connected to an output terminal of the first invertor; and a second invertor, an input terminal of the second invertor being connected to another electrode of the first conductivity type transistor; a third invertor, an input terminal of the third invertor being connected to an output terminal of the second invertor, an output terminal of the third invertor being connected to the output terminal of the dynamic latch circuit; and a second conductivity type second transistor, a control electrode of the second transistor being connected to the output terminal of the second invertor, one electrode of the second transistor being connected to a power source, another electrode of the second transistor being connected to the input terminal of the second invertor.

The frequency of either the first clock signal or the second clock signal may be different between the operation mode and the shifting mode.

Thus, the test circuit of the present invention comprises the parallel register which is formed by connecting the test data input terminal and the scan latch circuits in series, and the scan latch circuits are connected to the clock input terminal, the test control terminal, the output terminals of the first circuit part and the input terminals of the second circuit part which correspond to the output terminals of the first circuit part. Each scan latch circuit comprises the static latch circuit and the dynamic latch circuit. In the operation mode, each scan latch circuits transfers data which are outputted at the output terminals of the first circuit part to the input terminals of the second circuit part through its static latch circuit which operates in response to the first clock signal. In the shifting mode, the test data inputted to the test data input terminal are shifted in succession by one stage from a first scan latch circuit to the last scan latch circuit which are connected in series. In each scan latch circuit, the test data are latched in its static latch circuit and thereafter outputted through its dynamic latch circuit to a next stage scan latch circuit. Hence, a possibility of circuit failure in the normal operation mode in the test circuit will not exceed that in a conventional test circuit because data transmission from the first to the second circuit parts is accomplished through the static latch circuits in the operation mode. In addition, since the dynamic latch circuit is used as the slave since latch circuit, the test circuit includes less elements than a conventional scan latch circuit which shifts data through two static latch circuits does. Hence, less circuit area required for the test circuit is reduced.

Accordingly, an object of the present invention is to reduce the circuit area of a test circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
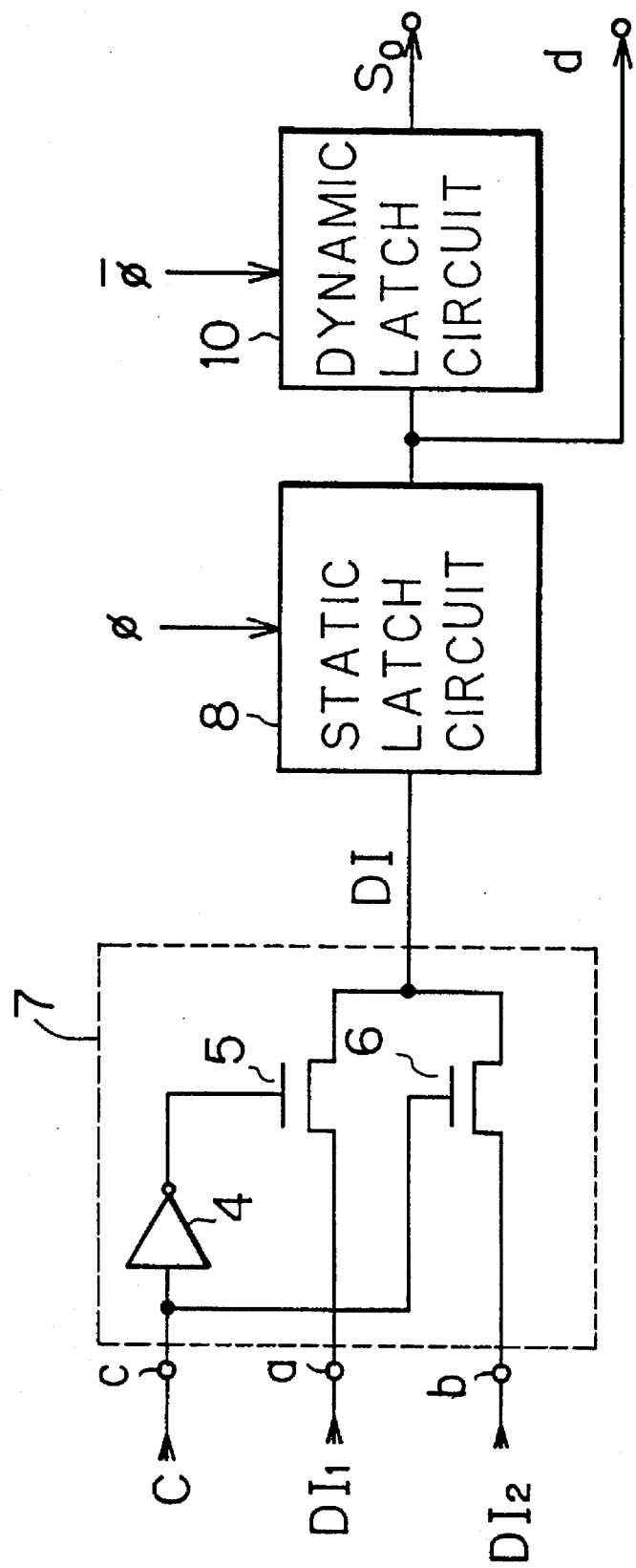
FIG. 4 is a block diagram showing a structure of a test circuit according to a preferred embodiment of the present invention.

A preferred embodiment of the present invention will be described below in relation to FIGS. 4 and 5A to 5D. FIG. 4 is a block diagram showing an example of the structure of a scan latch circuit according to the preferred embodiment. The scan latch circuit is formed by a multiplexer 7, a static latch circuit 8 and a dynamic latch circuit 10. The multiplexer 7 includes an invertor 4 and two transmission gates 5 and 6. In the multiplexer 7, a control signal C fed to a control terminal c is given to an input terminal of the invertor 4 and to a control electrode of the transmission gate 6, a signal $DI_1$ fed to a first input terminal a is given to one electrode of the transmission gate 5, and a signal $DI_2$ given to a second input terminal b is given to one electrode of the transmission gate 6. Hence, the control signal C of "L" level turns on the transmission gate 5 and turns off the transmission gate 6, allowing the signal $DI_1$ into the static latch circuits 8. On the other hand, with the control signal C of "H" level, the transmission gate 5 turns off and the transmission gate 6 turns on. As a result, the signal $DI_2$ is allowed into the static latch circuits 8.

The static latch circuit 8 and the dynamic latch circuit 10 form a master-slave latch circuit which operates in synchronism with a clock signal $\phi$. With the clock signal $\phi$ of "H" level, data DI are inputted to the static latch circuit 8 from the multiplexer 7. In response to the clock signal $\phi$ is switched to "L" level, the data DI are advanced to the dynamic latch circuit 10 and outputted therefrom while held in the static latch circuit 8. In short, circuit operation of the scan latch circuit for the control signal C of "L" level is to receive the signal $DI_1$ which is available at the first input terminal a and to output the same at output terminals d and $S_o$. If the control signal C has "H" level, on the other hand, the scan latch circuit receives the signal $DI_2$ which is available at the second input terminal b and output the same at the output terminals d and $S_o$.

Connections between the scan latch circuit and circuit parts and other scan latch circuits remain similar to those of the conventional scan latch circuits, and so do operations of the scan latch circuits.

In normal circuit operations, data are transmitted from a first circuit part to a second circuit part through the static latch circuits 8. Hence, a possibility of circuit failure in the normal operation mode in the preferred embodiment will not exceed that in an integrated circuit incorporating the conventional test circuit.

FIGS. 5A to 5D are circuit diagrams showing modifications of the dynamic latch circuit 10 which is used as a slave side latch circuit.

In FIGS. 5A to 5D, the symbol $TG_n$ denotes a transmission gate formed by an N type MOS transistor and the symbol $TG_p$ denotes a transmission gate formed by a P type MOS transistor. Indicated at IN1 to IN4 are invertors. The clock signal for triggering the dynamic latch circuits 10 into operation is indicated at $\phi_{in}$. A signal inputted to the dynamic latch circuit 10 is indicated at DI while a signal outputted from the dynamic latch circuit 10 is indicated at DO.

Figure 3A:
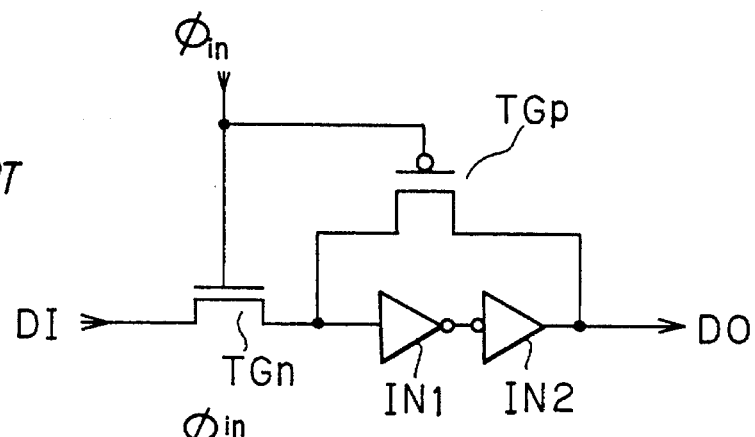
FIGS. 3A–3D are circuitry diagrams of static latch circuits which form the scan latch circuit of FIG. 2.
Figure 5A:
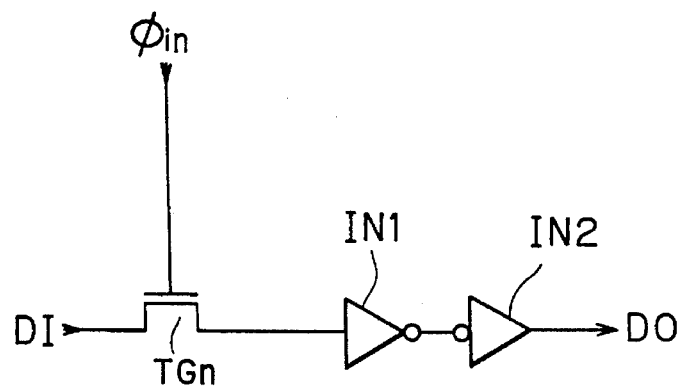
FIGS. 5A–5D are circuitry diagrams of dynamic latch circuits which form the scan latch circuit of FIG. 4.

A dynamic latch circuit of FIG. 5A is equal to the static latch circuit of FIG. 3A as simplified in structure. The dynamic latch circuit receives the data DI via one terminal of the transmission gate $TG_n$, which receives the control of the clock signal $\phi_{in}$ at its control electrode. Another terminal of the transmission gate $TG_n$ is connected to an input terminal of the invertor IN1 which has its output terminal connected to an input terminal of the invertor IN2. Hence, data DO are outputted at an output terminal of the invertor IN2.

The transmission gate $TG_n$ turns on in response to the clock signal $\phi_{in}$ of "H" level, thereby the data DI being entered into the dynamic latch circuit of FIG. 5A. Following this, the clock signal $\phi_{in}$ is switched to "L" level to turn off the transmission gate $TG_n$. As a result, the data DI are held in the dynamic latch circuit because of a parasitic capacity which is created, for example, at an output of the transmission gate $TG_n$, an input of the invertor IN1 or on connection lines. The data are then transmitted to the invertors IN1 and IN2, and outputted at the output terminal $S_o$ of the scan latch circuit as the output signal DO. It is to be noted that data transmission must be completed in a limited time since a time during which the data are held in the dynamic latch circuit 10 depends on the parasitic capacity. Thus, the scan latch circuit must operate at a high speed so as to complete the data transmission before the dynamic latch circuit 10 stops holding the data therein.

Figure 3B:
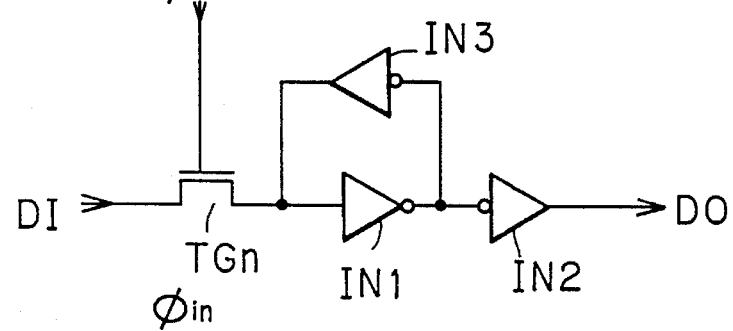
Figure 5B:
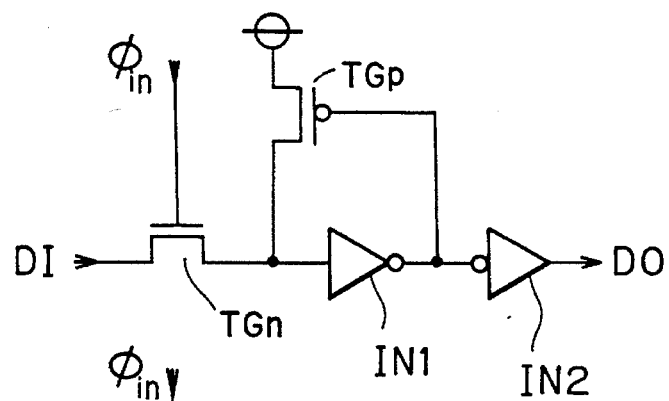

A dynamic latch circuit of FIG. 5B is equal to the static latch circuit of FIG. 3B as simplified in structure. In the dynamic latch circuit of FIG. 5B, the data DI are inputted to one terminal of the transmission gate $TG_n$, which receives the clock signal $\phi_{in}$ at its control electrode. Other terminal of the transmission gate $TG_n$ is connected to an input terminal of the invertor IN1 which has its output terminal connected to an input terminal of the invertor IN2. The data DO are outputted at an output terminal of the invertor IN2. The output terminal of the invertor IN1 is connected to a control electrode of the transmission gate $TG_p$. One electrode of the transmission gate $TG_p$ is connected to a power source while another electrode of the transmission gate $TG_p$ is connected to an input terminal of the invertor IN1. This structure ensures that the data are held in the dynamic latch circuit 10 for a long time.

Figure 3C:
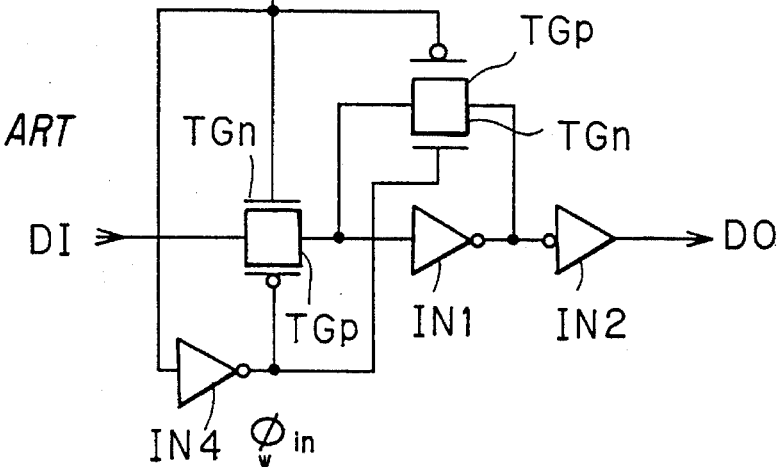
Figure 5C:
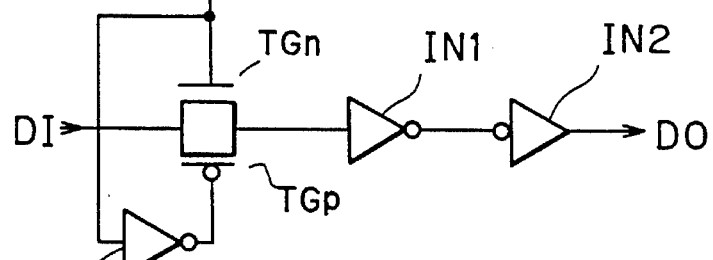

A dynamic latch circuit of FIG. 5C is equal to the static latch circuit of FIG. 3C as simplified in structure. In the dynamic latch circuit of FIG. 5C, the clock signal $\phi_{in}$ is fed to the invertor IN4 where it is inverted. The reverse signal is then supplied to a control electrode of the first transmission gate $TG_p$. The data DI are inputted to the transmission gate $TG_n$, which receives the clock signal $\phi_{in}$ at its control electrode, and to one terminal of the first transmission gate $TG_p$, which receives the reverse clock signal at its control electrode. Other terminals of the transmission gates $TG_n$ and $TG_p$ are connected to an input terminal of the invertor IN1. An output terminal of the invertor IN1 is connected to an input terminal of the invertor IN2. The data DO are outputted at an output terminal of the invertor IN2.

Figure 3D:
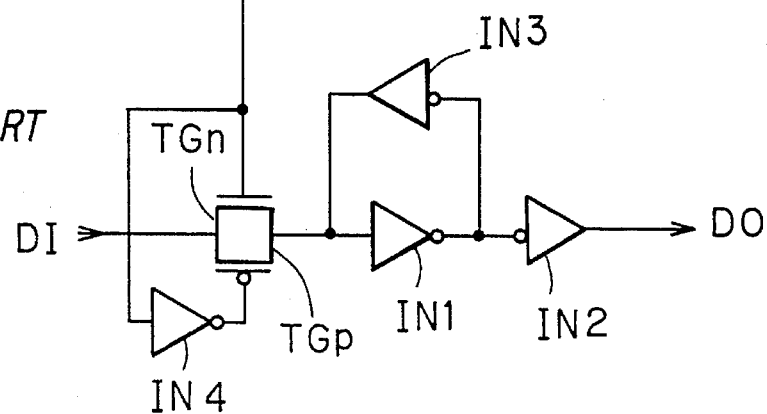
Figure 5D:
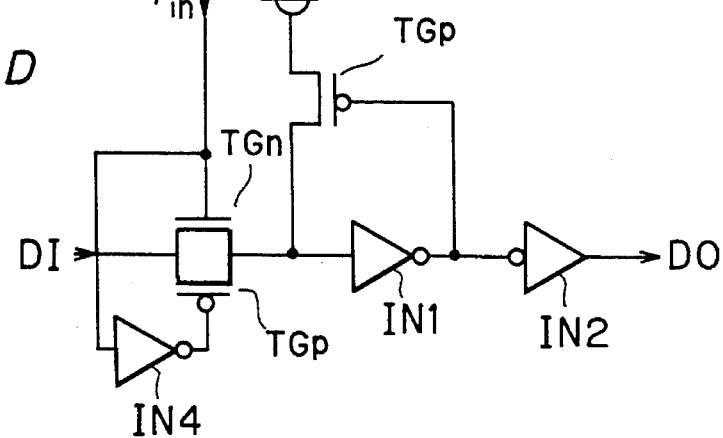

A dynamic latch circuit of FIG. 5D is equal to the static latch circuit of FIG. 3D as simplified in structure. In the dynamic latch circuit of FIG. 5D, the clock signal $\phi_{in}$ is fed to the invertor IN4 where it is inverted. The reverse clock signal is then supplied to a control electrode of the first transmission gate $TG_p$. The data DI are inputted to the transmission gate $TG_n$, which receives the clock signal $\phi_{in}$ at its control electrode, and to one terminal of the first transmission gate $TG_p$, which receives the reverse clock signal at its control electrode. Other terminals of the transmission gates $TG_n$ and $TG_p$ are connected to an input terminal of the invertor IN1. An output terminal of the invertor IN1 is connected to an input terminal of the invertor IN2. The data DO are outputted at an output terminal of the invertor IN2. Further, the output terminal of the invertor IN1 is connected to a control electrode of the transmission gate $TG_p$. One electrode of the transmission gate $TG_p$ is connected to a power source while other electrode of the transmission gate $TG_p$ is connected to an input terminal of the invertor IN1. This structure ensures that the data are held in the dynamic latch circuit 10 for a long time.

Although the foregoing has described that the circuits as shown in FIGS. 5A to 5D are used as the slave side latch circuit 10 in the preferred embodiment, the effects heretofore described will not be lost if other type of dynamic latch circuits are used instead.

The foregoing has also described that the shifting mode operation, in which the circuit parts are tested, and the normal mode operation are controlled by the same clock signal $\phi$. However, the frequency of the clock signal $\phi$ may be different between the shifting mode and the normal mode to thereby adjust an operation speed of the scan latch circuits. This is because data transmission must be completed in a limited time due to a fact that the dynamic latch circuit 10 holds the data depending on a parasitic capacity, and hence, the scan latch circuit must operate at a high speed so as to complete the data transmission before the dynamic latch circuit 10 stops keeping the data. The effects heretofore described will not be lost even in this modification.

Figure 1:
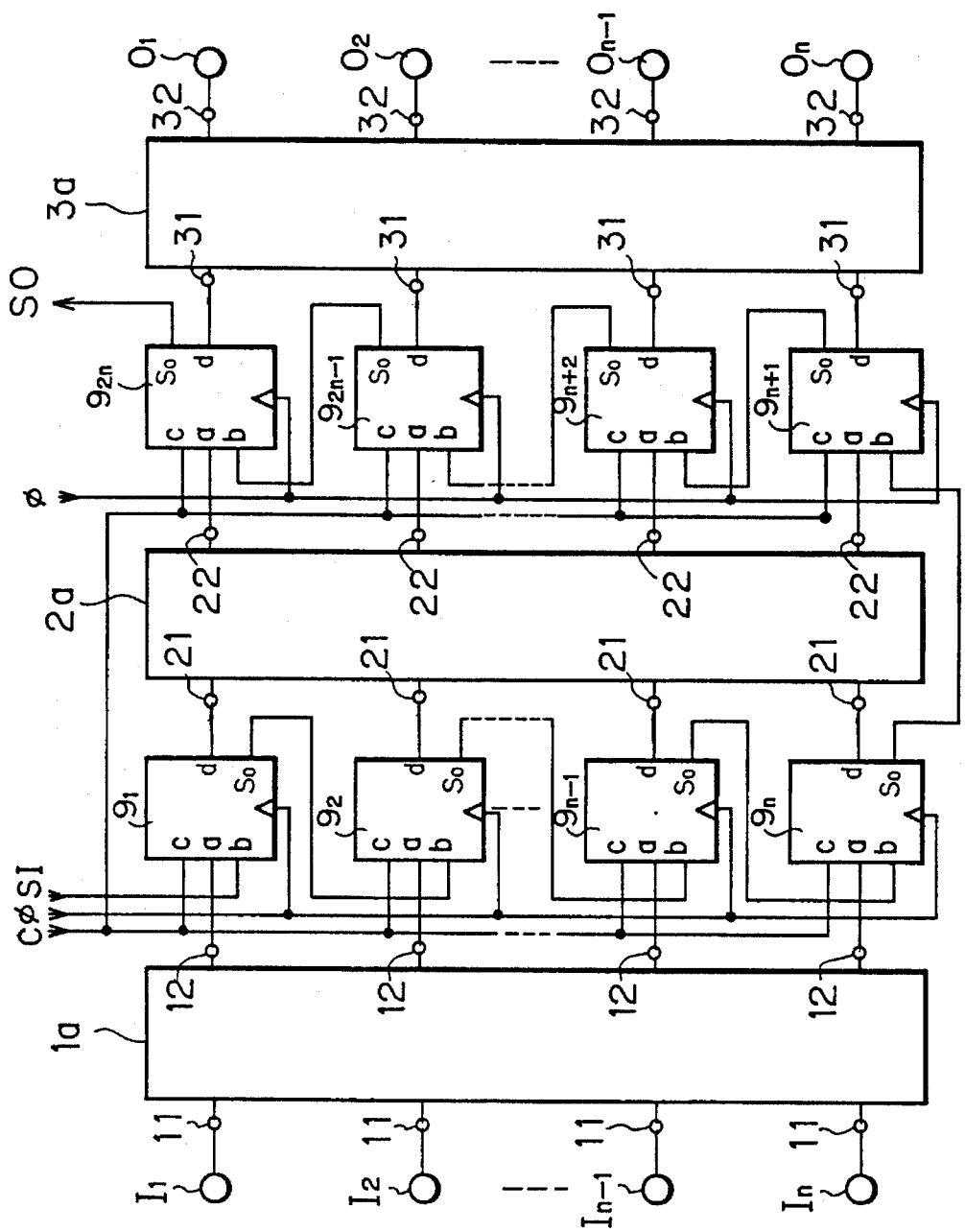
FIG. 1 is a block diagram showing a structure of a conventional test circuit.
Figure 2:
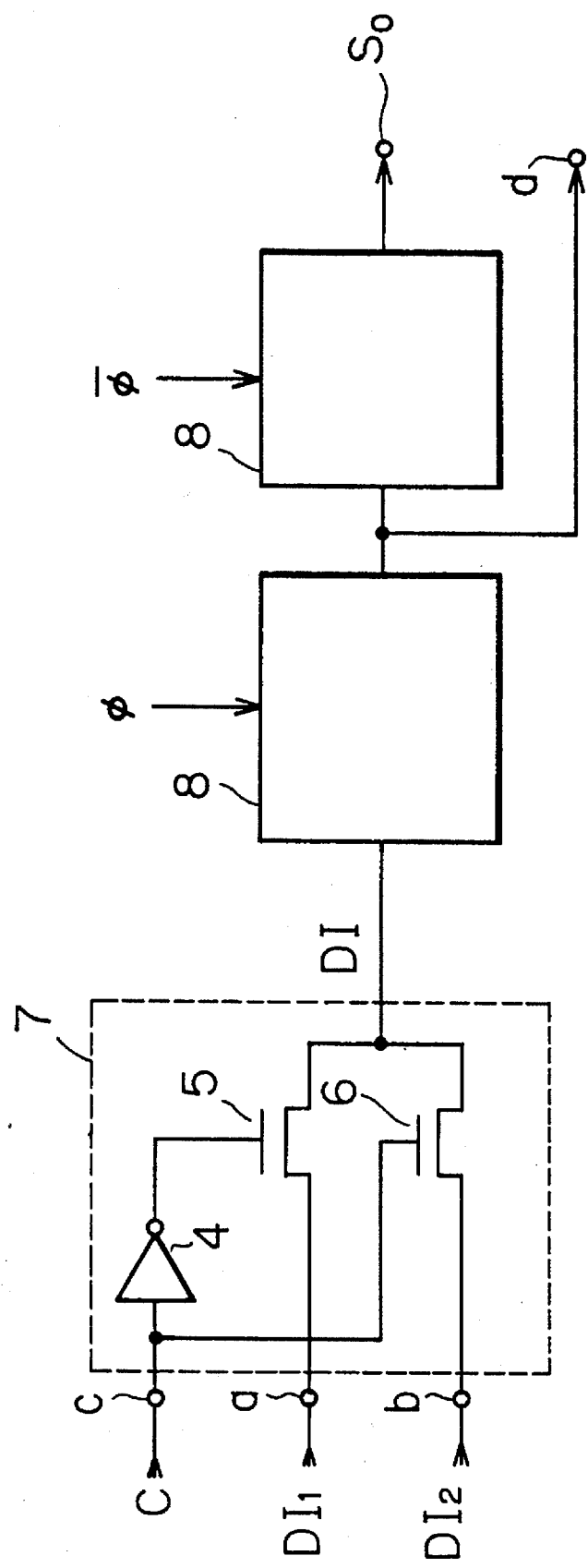
FIG. 2 is a block diagram showing a structure of a conventional scan latch circuit.
Figure 6:
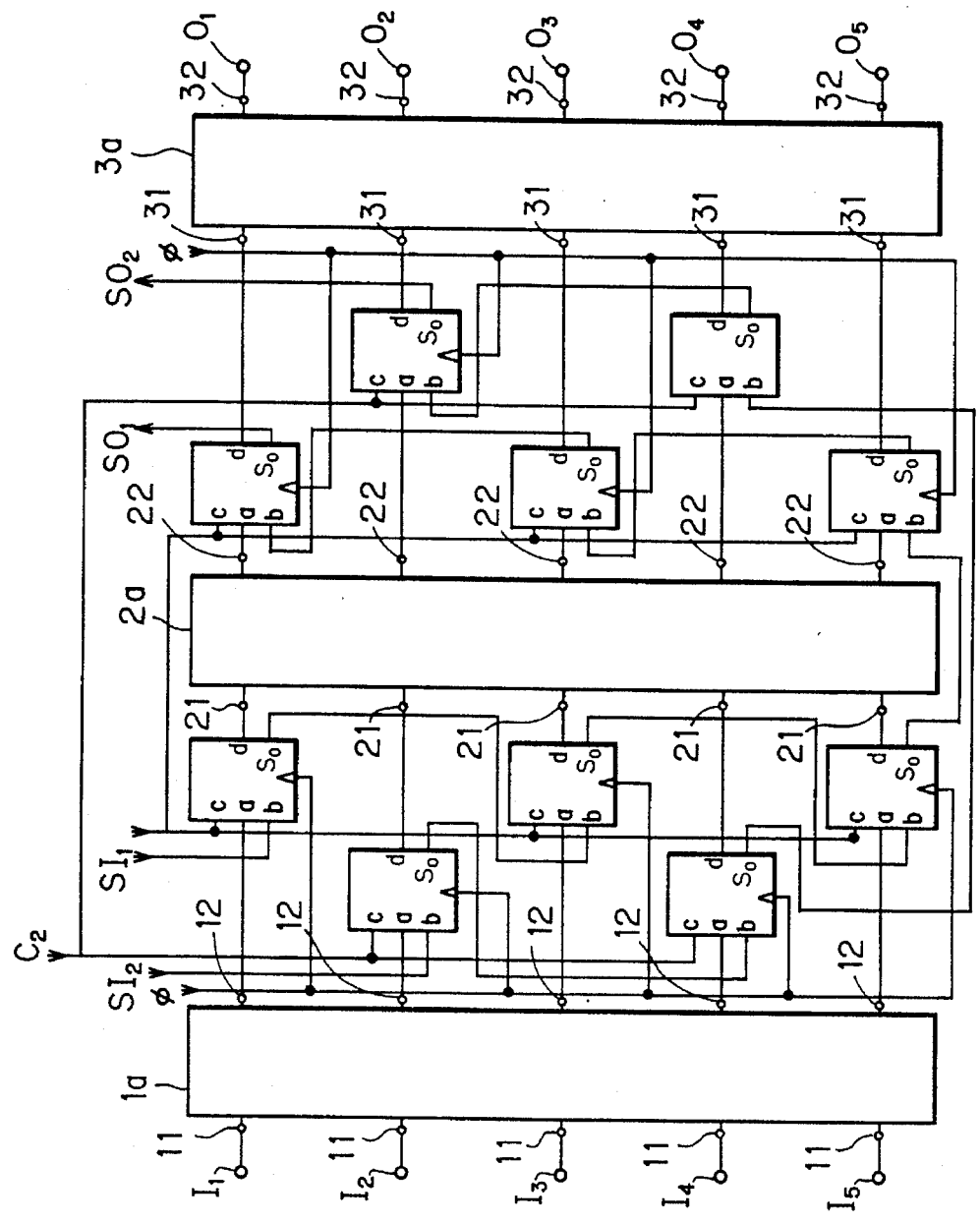
FIG. 6 is a block diagram showing the scan latch circuit of FIG. 4 connected to each other in an other manner.

Further, the preferred embodiment requires that one scan latch circuit has its second input terminals connected to the second output terminal of the next scan latch circuit so that the scan latch circuits as a whole can function as one shift register (FIG. 1). Instead, as shown in FIG. 6, the second input terminal of one scan latch circuit may be connected to the second output terminal of the second next scan latch circuit so that the scan latch circuits can serve as two shift registers. In this case, faster shifting is possible since signals are shifted for less times although circuit operations are more complex since a larger number of signals are used. In addition to faster shifting, circuit failure becomes less likely because shiftings to be performed per one scan latch circuit decrease in number. The effects as described in relation to the preferred embodiment above are ensured as well.

While the invention has been shown and described in detail, the foregoing description is in all aspects illustrative and not restrictive. It is understood that numerous modifications and variations can be devised without departing from the scope of the invention.

We claim:

1. A test circuit having a clock input terminal, a test control terminal and a test data input terminal, said test circuit being provided in a circuit having first and second circuit parts and being incorporated between said first circuit part and said second circuit part, said first circuit part having a plurality of output terminals, said second circuit part having a plurality of input terminals, said plurality of output terminals of said first circuit part corresponding to said plurality of input terminals of said second circuit part on a one-to-one basis, comprising:

a first parallel register connected to said clock input terminal and said test control terminal, said first parallel register including a plurality of scan latch circuits, said plurality of scan latch circuits being connected to said plurality of output terminals of said first circuit part and said plurality of input terminals of said second circuit part, said first parallel register being formed by connecting said test data input terminal and said plurality of scan latch circuits in series, wherein said plurality of scan latch circuits each comprise a static latch circuit which operates in response to a first clock signal which is inputted to said clock input terminal and a dynamic latch circuit which operates in response to a second clock signal which is inputted to said clock input terminal;

said plurality of scan latch circuits enter an operation mode in response to a first signal received at said test control terminal, in which case each one of said plurality of scan latch circuits transfers data which are outputted at said plurality of output terminals of said first circuit part to said plurality of input terminals of said second circuit part through a respective one of said static latch circuits;

said plurality of scan latch circuits enter a shifting mode in response to a second signal received at said test control terminal, in which case test data inputted to said test data input terminal are shifted in succession from a first scan latch circuit to a last scan latch circuit, said test data being shifted in such a manner that in each one of said plurality of scan latch circuits, said test data are latched in a corresponding static latch circuit and thereafter outputted through a corresponding dynamic latch circuit to a next stage scan latch circuit; and said second clock signal is obtained by inverting said first clock signal.

2. The test circuit of claim 1, wherein said plurality of scan latch circuits each further comprise:

a first input terminal connected to one of said plurality of output terminals of said first circuit part;

a second input terminal for receiving said test data, each of said plurality of scan latch circuits receiving said test data via said second input terminal from a preceding stage scan latch circuit except said first scan latch-circuit which receives said test data via said second input terminal from said test data input terminal;

a control terminal connected to said test control terminal for receiving a control signal from said test control terminal;

switching means for selectively advancing data which are inputted to said first input terminal or data which are inputted to said second input terminal to said static latch circuit;

a first output terminal for outputting data which are latched in said static latch circuit to one of said plurality of input terminals of said second circuit part; and a second output terminal for outputting data which are outputted from said dynamic latch circuit.

3. The test circuit of claim 2, wherein said second input terminals of said plurality of scan latch circuits and second output terminals of preceding stage scan latch circuits or said test data input terminal are connected so that said test data input terminal and said plurality of scan latch circuits are connected in series, and said control terminals of said plurality of scan latch circuits are all connected in common so that said plurality of scan latch circuits taken as a whole can function as a shift register.

4. The test circuit of claim 3, wherein said circuit in which said test circuit is provided further includes a third circuit part which has a plurality of input terminals which correspond to a plurality of output terminals of said second circuit part on a one-to-one basis;

said test circuit further comprising a second parallel register which is inserted between said second and said third circuit parts, which is connected to said clock input terminal and said test control terminal, and which includes a second plurality of scan latch circuits which are connected in series with each other, said second plurality of scan latch circuits being connected to said plurality of output terminals of said second circuit part and said plurality of input terminals of said third circuit part which correspond to said plurality of output terminals of said second circuit part; and said first parallel register inserted between said first and said second circuit parts and said second parallel register inserted between said second and said third circuit parts are connected in series in order to ensure data transmission therebetween, and control terminals of said plurality and said second plurality of scan latch circuits are all connected in common so that said first and second parallel registers can function as a shift register.

5. The test circuit of claim 2, wherein said switching means includes a multiplexer, said multiplexer comprising:

a data selector terminal which is connected to said control terminal;

a first data input terminal which is connected to said first input terminal;

a second data input terminal which is connected to said second input terminal; and a data output terminal which is connected to an input terminal of said static latch circuit.

6. The test circuit of claim 5, wherein said multiplexer comprises:

an invertor, an input terminal of said invertor being connected to said first data input terminal of said multiplexer;

a first transistor, a control electrode of said first transistor being connected to an output terminal of said invertor, one electrode of said first transistor being connected to said first data input terminal of said multiplexer, another electrode of said first transistor being connected to said input terminal of said static latch circuit; and a second transistor, a control electrode of said second transistor being connected to said data selector terminal of said multiplexer, one electrode of said second transistor being connected to said second data input terminal of said multiplexer, other electrode of said second transistor being connected to said input terminal of said static latch circuit.

7. The test circuit of claim 1, wherein said dynamic latch circuit includes:

a first conductivity type transistor, one electrode of said first conductivity type transistor being connected to an input terminal of said dynamic latch circuit, and a control electrode of said first conductivity type transistor receiving said second clock signal;

a first invertor, an input terminal of said first invertor being connected to another electrode of said first conductivity type transistor;

a second invertor, an input terminal of said second invertor being connected to an output terminal of said first invertor, and an output terminal of said second invertor being connected to said next stage scan latch circuit; and a second conductivity type transistor, a control electrode of said second conductivity type transistor being connected to said output terminal of said first invertor, one electrode of said second conductivity type transistor being connected to a power source, and another electrode of said second conductivity type transistor being connected to said input terminal of said first invertor.

8. The test circuit of claim 1, wherein said dynamic latch circuit includes:

a first conductivity type transistor, one electrode of said first conductivity type transistor being connected to an input terminal of said dynamic latch circuit, and a control electrode of said first conductivity type transistor receiving said second clock signal;

a first invertor, an input terminal of said first invertor receiving said second clock signal;

a second conductivity type first transistor, one electrode of said second conductivity type first transistor being connected to said input terminal of said dynamic latch circuit, a control electrode of said second conductivity type first transistor being connected to an output terminal of said first invertor, and another electrode of said second conductivity type first transistor being connected to another electrode of said first conductivity type transistor;

a second invertor, an input terminal of said second invertor being connected to said another electrode of said first conductivity type transistor;

a third invertor, an input terminal of said third invertor being connected to an output terminal of said second invertor, and an output terminal of said third invertor being connected to an output terminal of said dynamic latch circuit; and a second conductivity type second transistor, a control electrode of said second conductivity type second transistor being connected to said output terminal of said second invertor, one electrode of said second conductivity type second transistor being connected to a power source, and another electrode of said second conductivity type second transistor being connected to said input terminal of said second invertor.

9. The test circuit of claim 1, wherein a frequency of said first clock signal and said second clock signal in said shifting mode is higher than in said operation mode.

10. A test circuit having a clock input terminal, a test control terminal and first and second test data input terminals, said test circuit being provided in an integrated circuit which includes a first circuit part having a plurality of output terminals and a second circuit part having a plurality of input terminals corresponding to said plurality of output terminals on a one-to-one basis, comprising:

a plurality of scan latch circuits respectively connected to said plurality of input terminals and said plurality of output terminals, wherein each of said plurality of scan latch circuits has a static latch circuit and a dynamic latch circuit which operate in response to a clock signal inputted to said clock input terminal;

said plurality of scan latch circuits enter an operation mode in response to a first signal received at said test control terminal and transfer data from said plurality of output terminals to said plurality of input terminals, respectively, through a respective static latch circuit;

said plurality of scan latch circuits enter a shifting mode in response to a second signal received at said test control terminal, in which case test data inputted to said first test data input terminal are shifted from a first scan latch circuit to a third scan latch circuit and test data inputted to said second test data input terminal are shifted from a second scan latch circuit to a fourth scan latch circuit; and in each one of said first to fourth scan latch circuits, said test data are latched in a corresponding static latch circuit and thereafter outputted through a corresponding dynamic latch circuit to a next stage scan latch circuit.

11. A test circuit disposed between a first circuit part having a plurality of output terminals and a second circuit part having a corresponding plurality of input terminals, comprising:

a plurality of scan latch circuits arranged in series;

each of said plurality of scan latch circuits has a data input terminal connected to a respective one of said plurality of output terminals;

each of said plurality of scan latch circuits comprises a static latch circuit having a first output terminal and a dynamic latch circuit having a second output terminal;

said first output terminals of said plurality of scan latch circuits are respectively connected to one of said plurality of input terminals;

odd ones of said dynamic latch circuits are connected together to form a first shift register having a first shift output; and even ones of said dynamic latch circuits are connected together to form a second shift register having a second shift output.

12. A test circuit having a clock input terminal, a test control terminal and a test data input terminal, said test circuit being provided in a circuit having first and second circuit parts and being incorporated between said first circuit part and said second circuit part, said first circuit part having a plurality of output terminals, said second circuit part having a plurality of input terminals, said plurality of output terminals of said first circuit part corresponding to said plurality of input terminals of said second circuit part on a one-to-one basis, comprising:

a parallel register connected to said clock input terminal and said test control terminal, said parallel register including a plurality of scan latch circuits, said plurality of scan latch circuits being connected to said plurality of output terminals of said first circuit part and said plurality of input terminals of said second circuit part which correspond to said plurality of output terminals of said first circuit part, said parallel register being formed by connecting said test data input terminal and said plurality of scan latch circuits in series, wherein said plurality of scan latch circuits each comprise a static latch circuit which operates in response to a first clock signal which is inputted to said clock input terminal and a dynamic latch circuit which operates in response to a second clock signal which is inputted to said clock input terminal;

said plurality of scan latch circuits enter an operation mode in response to a first signal received at said test control terminal, in which case each one of said plurality of scan latch circuits transfers data which are outputted at said plurality of output terminals of said first circuit part to said plurality of input terminals of said second circuit part through a respective static latch circuit; and said plurality of scan latch circuits otherwise enter a shifting mode in response to a second signal received at said test control terminal, in which case test data inputted to said test data input terminal are shifted in succession by one stage from a first scan latch circuit to a last scan latch circuit which are connected in series, said test data being shifted in such a manner that in each one of said plurality of scan latch circuits, said test data are latched in said respective static latch circuit and thereafter outputted through a respective dynamic latch circuit to a next stage scan latch circuit; and wherein said dynamic latch circuit includes:
- a first conductivity type transistor, one electrode of said first conductivity type transistor being connected to an input terminal of said dynamic latch circuit, and a control electrode of said first conductivity type transistor receiving said second clock signal;
- a first invertor, an input terminal of said first invertor being connected to another electrode of said first conductivity type transistor;
- a second invertor, an input terminal of said second invertor being connected to an output terminal of said first invertor, and an output terminal of said second invertor being connected to said next stage scan latch circuit; and
- a second conductivity type transistor, a control electrode of said second conductivity type transistor being connected to said output terminal of said first invertor, one electrode of said second conductivity type transistor being connected to a power source, and another electrode of said second conductivity type transistor being connected to said input terminal of said first invertor.

13. A test circuit having a clock input terminal, a test control terminal and a test data input terminal, said test circuit being provided in a circuit having first and second circuit parts and being incorporated between said first circuit part and said second circuit part, said first circuit part having a plurality of output terminals, said second circuit part having a plurality of input terminals, said plurality of output terminals of said first circuit part corresponding to said plurality of input terminals of said second circuit part on a one-to-one basis, comprising:

a parallel register connected to said clock input terminal and said test control terminal, said parallel register including a plurality of scan latch circuits, said plurality of scan latch circuits being connected to said plurality of output terminals of said first circuit part and said plurality of input terminals of said second circuit part which correspond to said plurality of output terminals of said first circuit part, said parallel register being formed by connecting said test data input terminal and said plurality of scan latch circuits in series, wherein
said plurality of scan latch circuits each comprise a static latch circuit which operates in response to a first clock signal which is inputted to said clock input terminal and a dynamic latch circuit which operates in response to a second clock signal which is inputted to said clock input terminal;

said plurality of scan latch circuits enter an operation mode in response to a first signal received at said test control terminal, in which case each one of said plurality of scan latch circuits transfers data which are outputted at said plurality of output terminals of said first circuit part to said plurality of input terminals of said second circuit part through a respective static latch circuit; and said plurality of scan latch circuits enter a shifting mode in response to a second signal received at said test control terminal, in which case test data inputted to said test data input terminal are shifted in succession by one stage from a first scan latch circuit to a last scan latch circuit which are connected in series, said test data being shifted in such a manner that in each one of said plurality of scan latch circuits, said test data are latched in said respective static latch circuit and thereafter outputted through a respective dynamic latch circuit to a next stage scan latch circuit; and wherein said dynamic latch circuit includes:
- a first conductivity type transistor, one electrode of said first conductivity type transistor being connected to an input terminal of said dynamic latch circuit, and a control electrode of said first conductivity type transistor receiving said second clock signal;
- a first invertor, an input terminal of said first invertor receiving said second clock signal;
- a second conductivity type first transistor, one electrode of said second conductivity type first transistor being connected to said input terminal of said dynamic latch circuit, and a control electrode of said second conductivity type first transistor being connected to an output terminal of said first invertor;
- a second invertor, an input terminal of said second invertor being connected to another electrode of said first conductivity type transistor;
- a third invertor, an input terminal of said third invertor being connected to an output terminal of said second invertor, and an output terminal of said third invertor being connected to an output terminal of said dynamic latch circuit; and
- a second conductivity type second transistor, a control electrode of said second conductivity type second transistor being connected to said output terminal of said second invertor, one electrode of said second conductivity type second transistor being connected to a power source, and another electrode of said second conductivity type second transistor being connected to said input terminal of said second invertor.

* * * * *